United States Patent [19]
Sakagami

[11] Patent Number: 5,144,578
[45] Date of Patent: Sep. 1, 1992

[54] SEMICONDUCTOR DEVICE HAVING MULTIPLE SUPPLY POTENTIAL PATHS FOR REDUCING ELECTRICAL INTERFERENCE BETWEEN CIRCUITS CONTAINED THEREIN

[75] Inventor: Masahiko Sakagami, Takatsuki, Japan

[73] Assignee: Matsushita Electric Industrial Co., Ltd., Osaka, Japan

[21] Appl. No.: 358,610

[22] Filed: May 30, 1989

[30] Foreign Application Priority Data

May 27, 1988 [JP] Japan .................... 63-130690

[51] Int. Cl.$^5$ .................... G11C 5/06; H01L 21/00
[52] U.S. Cl. .................... 365/63; 365/51
[58] Field of Search .................... 365/63, 51, 226; 357/65, 68

[56] References Cited
U.S. PATENT DOCUMENTS

| | | | |
|---|---|---|---|
| 4,403,240 | 9/1983 | Seki et al. | 357/65 X |
| 4,535,423 | 8/1985 | Nozaki et al. | 365/51 |
| 4,725,980 | 2/1988 | Wakimoto et al. | 365/185 |
| 4,833,656 | 5/1989 | Tobita | 365/226 |

Primary Examiner—Joseph A. Popek
Attorney, Agent, or Firm—Wenderoth, Lind & Ponack

[57] ABSTRACT

A semiconductor device contains circuits composed on a semiconductor substrate which are divided at least into two circuit blocks as seen from the aspect of supplying electrical power, and the pad and wiring for feeding a supply potential and/or grounding potential to the first circuit block, and the pad and wiring for feeding the supply potential and/or grounding potential to the second circuit block other than the first circuit block are electrically independent of each other. In this constitution, it is possible to prevent malfunctions of the second circuit block and distortions of the output signal due to fluctuations of the supply potential or grounding potential occurring during operation of the first circuit block. It is also possible to prevent malfunctions of the first circuit block and distortions of the signal on the first circuit block due to fluctuations of the supply potential or grounding potential occurring due to a malfunction of the second circuit block.

6 Claims, 7 Drawing Sheets

SEMICONDUCTOR DEVICE HAVING MULTIPLE SUPPLY POTENTIAL PATHS FOR REDUCING ELECTRICAL INTERFERENCE BETWEEN CIRCUITS CONTAINED THEREIN

BACKGROUND OF THE INVENTION

This invention relates to a semiconductor device in which the circuit composed on a semiconductor substrate is operated when either one or both of a supply potential and grounding potential are supplied from outside the semiconductor substrate.

Recently, as semiconductor devices are becoming higher in their degree of integration and faster in operation, miniaturization of patterns and multiple-layer wiring structures on the semiconductor substrate are being promoted.

Figure 9:
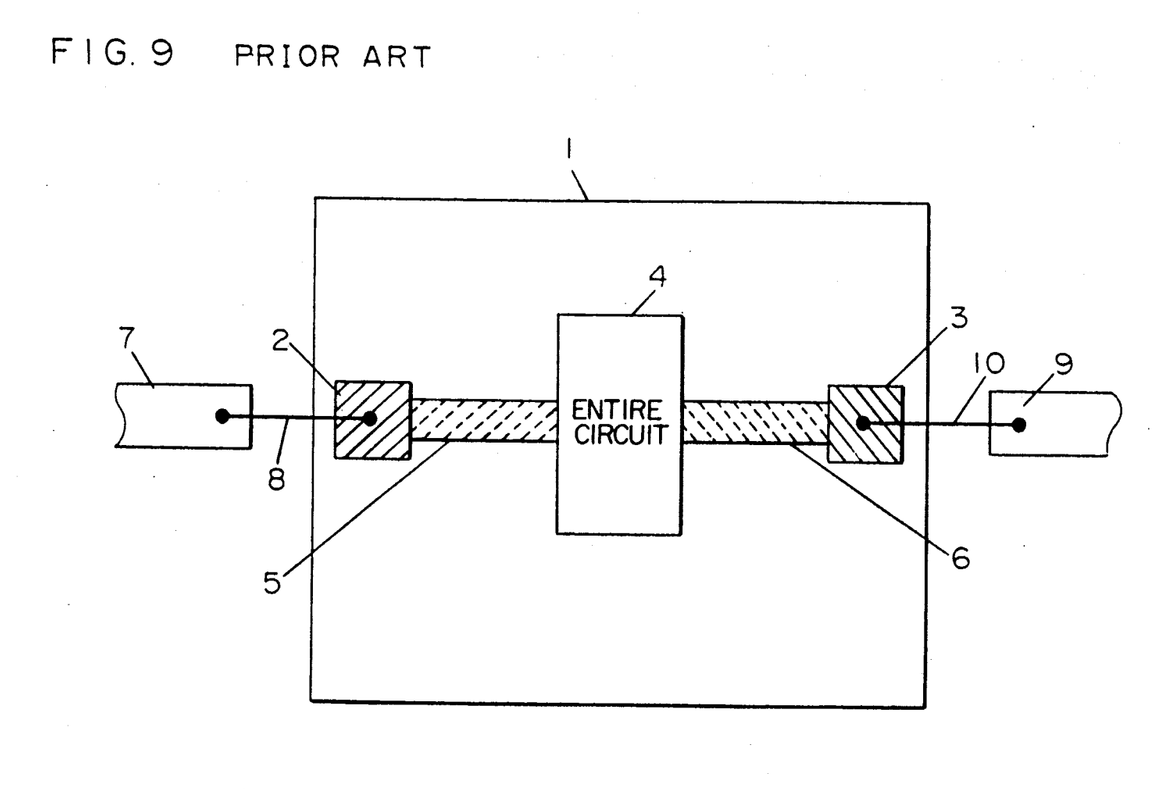
FIG. 9 is a plan view of a conventional semiconductor device.

FIG. 9 shows a conventional example of a method of supplying a supply potential and a grounding potential in a semiconductor device.

A semiconductor substrate 1 comprises, on its upper surface, a wire bonding pad (Vcc pad) 2 for feeding a supply potential (called Vcc) from outside the semiconductor substrate 1, and a wire bonding pad (Vss pad) 3 for supplying a grounding potential (called Vss) from outside the semiconductor substrate 1. An entire circuit 4 is composed on the semiconductor substrate 1, and the pads 2 and 3 are connected respectively by means of Vcc wiring 5 and Vss wiring 6. The Vcc pad 2 is provided with Vcc from an external lead for Vcc 7 through a Vcc feed wire 8, and the Vss pad 3 is provided with Vss from an external lead for Vss 9 through a Vss feed wire 10.

In this constitution, the entire circuit 4 composed on the semiconductor substrate 1 is operated when provided with Vcc through common Vcc feed part (7, 8, 2, 5), and with Vss through common Vss feed part (9, 10, 3, 6).

Generally, the Vcc feed part (7, 8, 2, 5) and Vss feed part (9, 10, 3, 6) are made of metals having an extermely small resistance. Recently, however, as a result of fine-pattern and multiple-layer structure in the trend of a higher degree of integration of semiconductor devices, the wiring layer has become extremely thin, and the resistance ignored hitherto can no longer be disregarded, which has induced various problems.

For example, if there is an output transistor for transmitting signals to outside of the semiconductor device 1 in the entire circuit 4, the current flowing in this output transistor is much larger than the current flowing in the other circuits.

Figure 10:
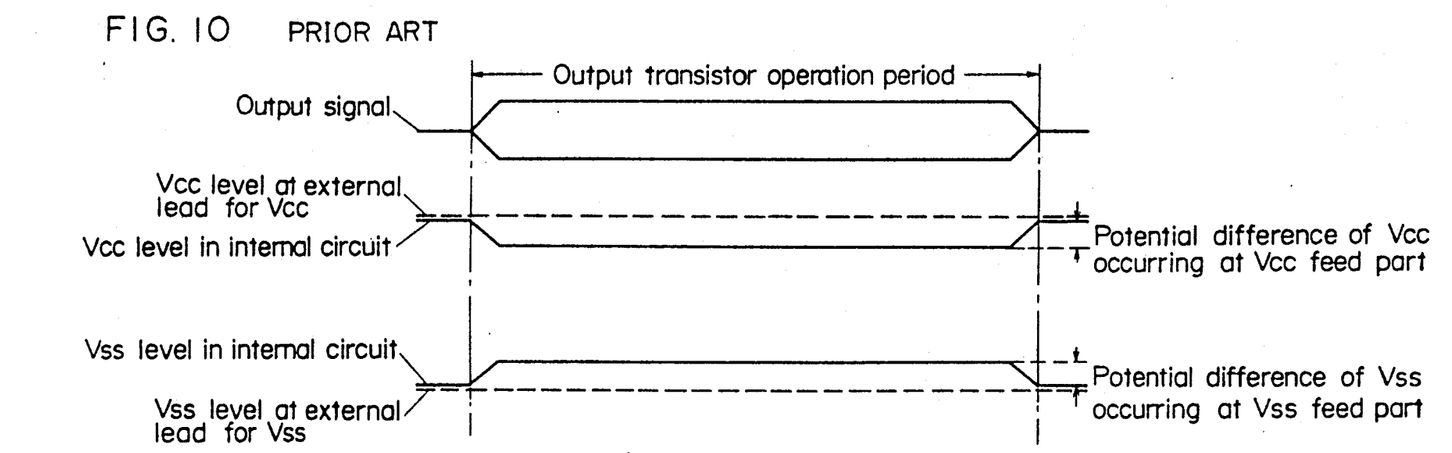
FIG. 10 and FIG. 11 are voltage waveform diagrams for explaining the operation of FIG. 9.

Fluctuations of Vcc and Vss during operation of the output transistor are shown in FIG. 10.

When the output transistor operates, a current flows into the output transistor from the external lead for Vcc 7 shown in FIG. 9 through wire 8, pad 2 and wiring 5, and from the output transistor the current flows into the external lead for Vss 9 through wiring 6, pad 3, and wire 10. At this time, the unignorable resistance is present in the Vcc feed part and Vss feed part as mentioned above, and this resistance causes the production of a potential difference between the Vcc outside the semiconductor substrate 1 and the Vcc supplied in the internal cirucit. Similarly, a potential difference occurs between the Vss outside the semiconductor substrate 1 and the Vss supplied in the internal circuit. As a result of these potential differences, the internal circuits other than the output transistor malfunction.

Figure 11:
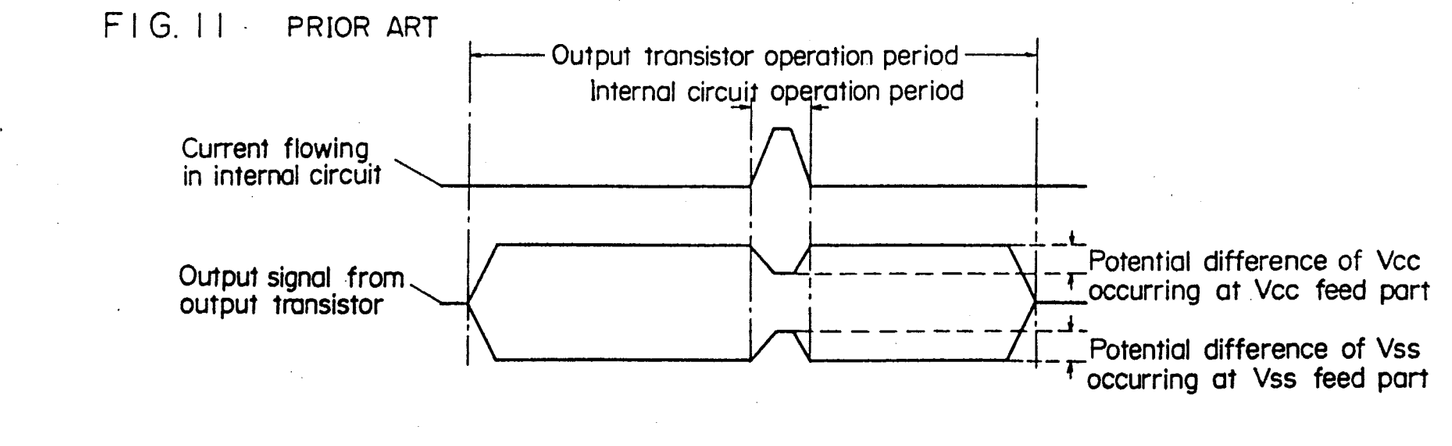

FIG. 11 shows changes of the output signal potential from the output transistor when other internal circuits operate during operation of the output transistor.

During operation of the output transistor, if other internal circuits operate, a current flows into the Vcc feed part and Vss feed part by the operation of the internal circuits, and changes occur in the Vcc and Vss to be supplied in the output transistor, so that a distortion is caused in the output signal potential of the output transistor.

SUMMARY OF THE INVENTION

It is hence a first object of this invention to divide the circuits composed on the semiconductor substrate at least into two circuit blocks as seen from the aspect of the supply of electrical power, and to electrically isolate the pad and wiring for feeding Vcc in the first circuit block, and the pad and wiring for feeding Vcc in the second circuit block.

It is a second object of the invention to electrically isolate the pad and wiring for feeding Vss in the first circuit block, and the pad and wiring for feeding Vss in the second circuit block.

It is a third object of the invention to electrically isolate the pad and wiring for feeding Vcc in the first circuit block, and the pad and wiring for feeding Vcc in the second circuit block, and to electrically isolate the pad and wiring for feeding Vss in the first circuit block, and the pad and wiring for feeding Vss in the second circuit block.

By such a composition, malfunctions of the second circuit block due to Vcc fluctuations or Vss fluctuations occurring during operation of the first circuit block and distortion of the output signal may be prevented. At the same time, malfunctions of the first circuit block and distortion of output signal from the first circuit block due to Vcc fluctuations or Vss fluctuations occurring in the event of malfunctions of the second circuit block may be prevented.

These and other features of the invention will be better understood and appreciated from the following detailed description of the embodiments taken in conjunction with the drawings.

DETAILED DESCRIPTION OF THE INVENTION

Figure 1:
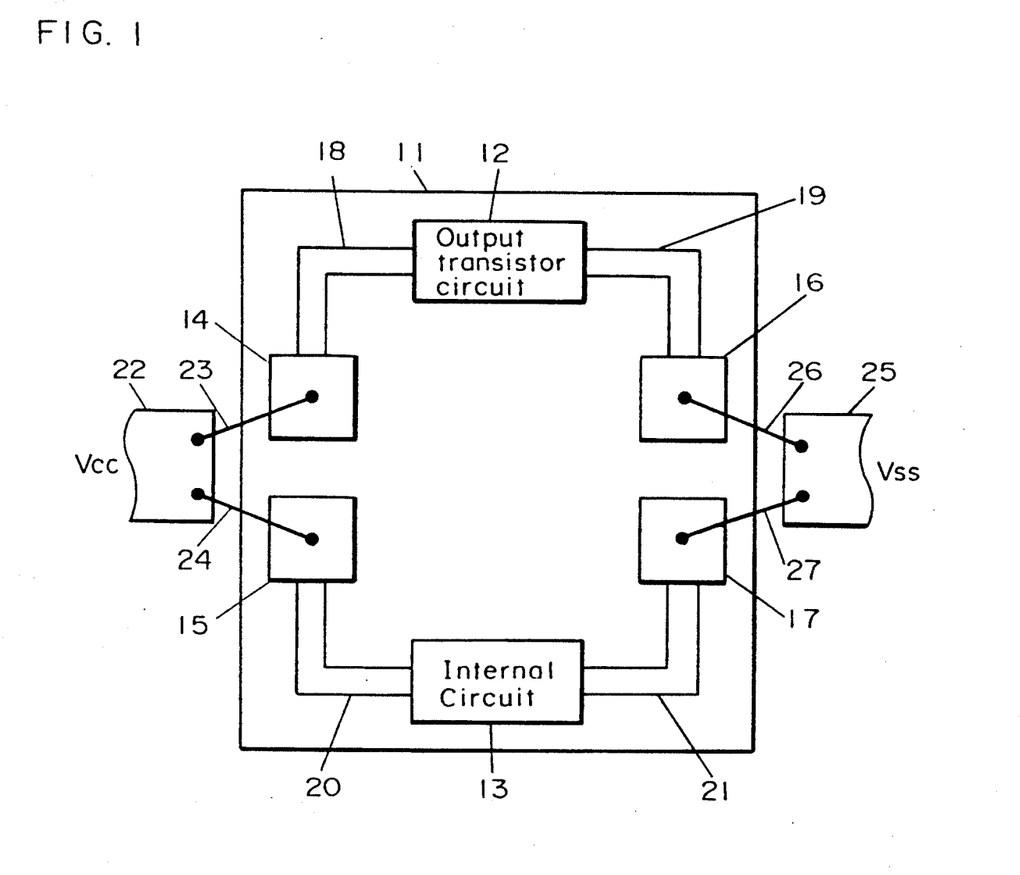
FIG. 1 is a conceptual drawing of a semiconductor device in accordance with a first embodiment of the present invention.

FIG. 1 is a conceptual drawing of a semiconductor device in accordance with a first embodiment of the present invention.

In FIG. 1 an output transistor circuit 12, and another internal circuit 13 other than the output transistor circuit 12 are composed on a semiconductor substrate 11, being divided into two blocks as seen from the power supply aspect. Two Vcc pads 14 and 15 are formed at the Vcc feed side, and two Vss pads 16 and 17 are formed at the Vss feed side. The Vcc pad 14 and the output transistor circuit 12 are connected through a Vcc wiring 18, and the output transistor circuit 12 and Vss pad 16 are connected through a Vss wiring 19. On the other hand, the Vcc pad 15 and the other internal circuit 13 are connected through a Vcc wiring 20, and the internal circuit 13 and Vss pad 17 are connected through a Vss wiring 21. To the Vcc pad 14, Vcc is supplied from outside the semiconductor substrate 11 through the external lead for Vcc 22 and wire 23, and to the Vcc pad 15, Vcc is supplied through the external lead for Vcc 22 and wire 24. On the other hand, to the Vss pad 16, Vss is supplied from outside the semiconductor substrate 11 through the external lead for Vss 25 and wire 26, and to the Vss pad 17, Vss is supplied through the external lead for Vss 25 and wire 27.

In the constitution in FIG. 1, during operation of the output transistor circuit 12, the current flows from the external lead for Vcc 22 into the external pad for Vss 25 in the route of 23, 14, 18, 12, 19, 16 and 26 and does not flow into the Vcc feed part (24, 15, 20) and Vss feed part (21, 17, 27) in the internal circuit 13. Accordingly, the Vcc and Vss supplied to the internal circuit 13 do not fluctuate, and hence, a malfunction does not occur in the internal circuit 13.

On the other hand, when the internal circuit 13 operates during operation of the output transistor circuit 12, the current by the operation of the internal circuit 13 flows from the external lead for Vcc 22 into the external lead for Vss in the route of 24, 15, 20, 13, 21, 17 and 27, and does not flow into the Vcc feed part (23, 14, 18) and Vss feed part (19, 16, 26) in the output transistor circuit 12. Hence, the Vcc and Vss supplied into the output transistor circuit 12 do not fluctuate, and therefore the output signal of the output transistor circuit 12 is hardly distorted.

Figure 2:
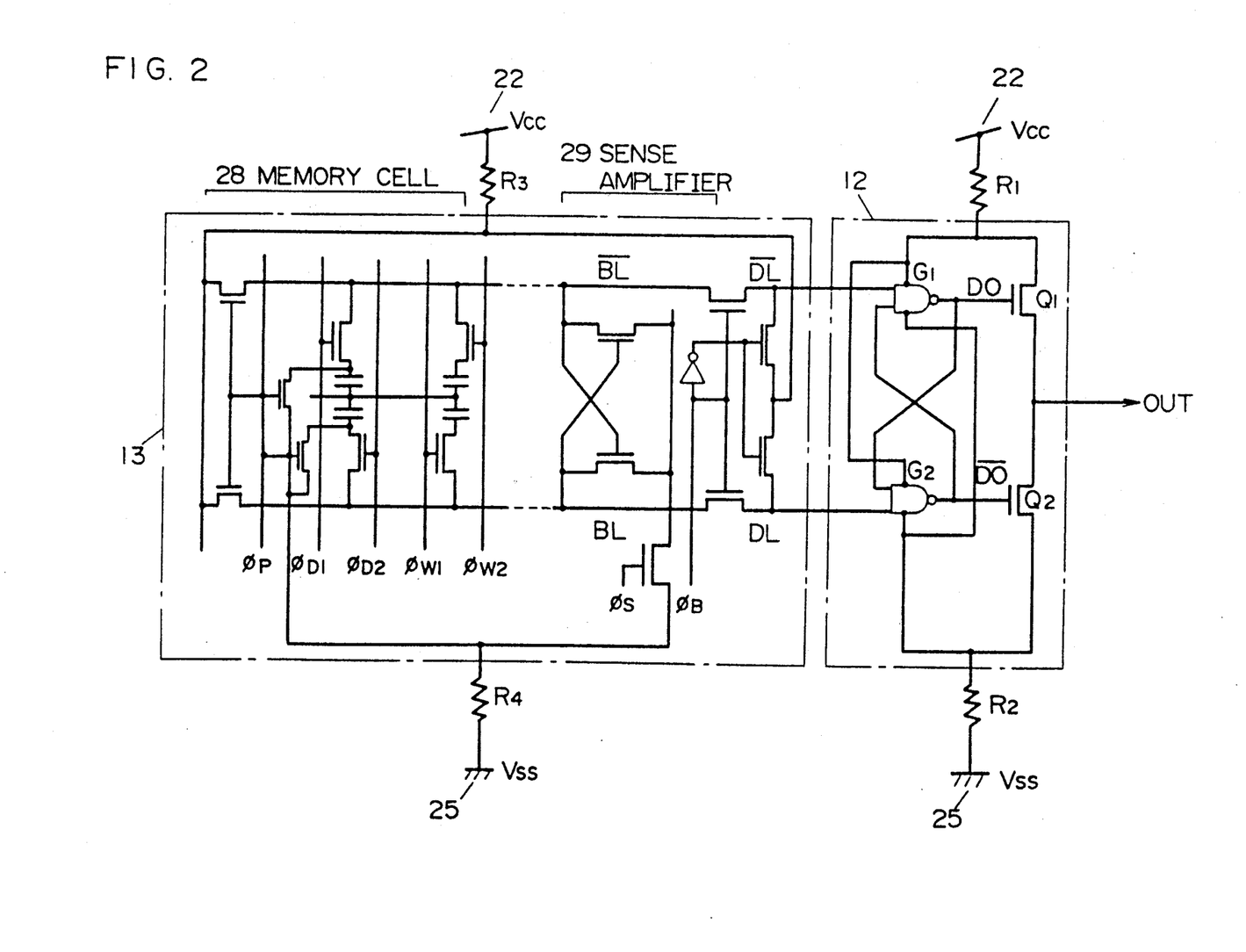
FIG. 2 is a circuit diagram showing an essential part of the practical circuit of the first embodiment.

FIG. 2 shows the essential parts of the practical circuit of the embodiment shown in FIG. 1.

In FIG. 2, the output transistor circuit 12 contains totem pole type output transistors Q1 and Q2, and output buffer comprising NAND gates G1 and G2 for driving these output transistors Q1 and Q2. These output transistors Q1 and Q2, and output buffer G1 and G2 are provided with Vcc from the external lead for Vcc 22 shown in FIG. 1, through an impedance R1 possessed by the Vcc wiring 18, etc., and also with Vss from the external lead for Vss 25 shown in FIG. 1, through an impedance R2 possessed by the Vss wiring 19, etc.

On the other hand, the internal circuit 13 contains memory circuits, such as memory cell 28 and sense amplifier 29, and as it is well known to those skilled in the art, the desired data stored in the memory cell 28 is read out by the pulses such as bit line precharge pulse $\phi p$, dummy word line pulses $\phi D1$ and $\phi D2$, word line pulses $\phi w1$ and $\phi w2$, sense amplifier drive pulse $\phi s$, and bit line selection signal $\phi B$. To the internal circuit 13, the Vcc from the external lead for Vcc 22 shown in FIG. 1 is supplied through an impedance R3 possessed by Vcc wiring 20, etc., and the Vss is supplied from the external lead for Vss 25 through an impedance R4 possessed by the Vss wiring 21, etc.

Figure 3:
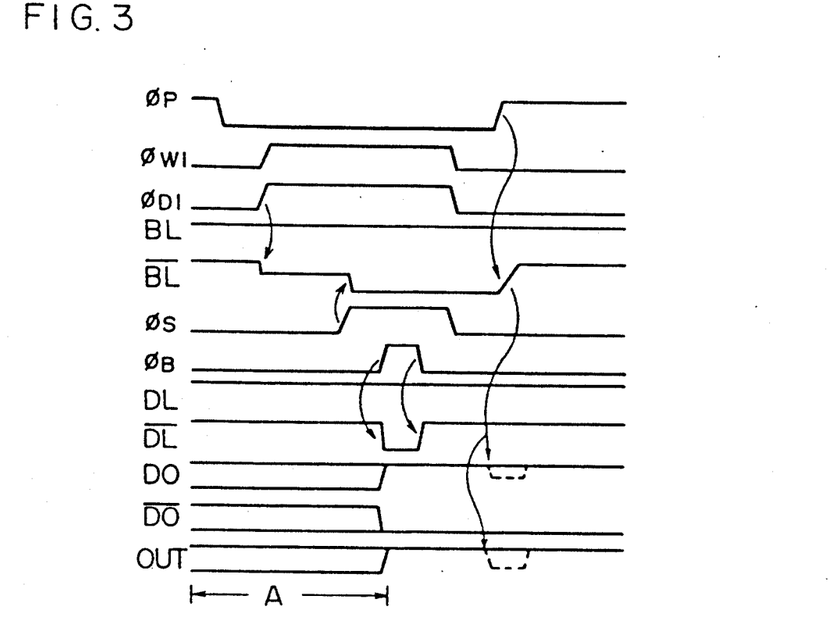
FIG. 3, FIG. 4 are voltage waveform diagrams for explaining the operation of FIG. 2.

FIG. 3 shows the voltage waveforms of the pulses and bit line signals BL and $\overline{BL}$, data line signals DL and $\overline{DL}$, and output buffer output signals DO and $\overline{DO}$ when reading out H level outputs to the output terminal out shown in FIG. 2.

The operation of reading out the data from the memory cell 28 itself is known to those skilled in the art and a detailed description thereof has been omitted, and only the characteristic action of this invention is explained below.

In FIG. 3, when the bit line precharge pulse $\phi p$ is changed to a high level, the memory cell 28 is placed in a precharge state. At this time, if, as in the prior art, the Vcc line of the internal circuit 13 and output transistor circuit 12 is commonly connected, and the Vcc from the external lead for Vcc 22 is supplied on the common Vcc line through a common impedance (e.g. R1), the following malfunction occurs. That is, since the entire bit line capacity is very large, when the bit line is precharged, a large current (I1) flows into the common Vcc line through the common impedance R1 from the Vcc. When this large current I1 flows through the common impedance R1 the supply potential applied to the output buffer G1 and G2 of the output transistor circuit 12 drops to Vcc−I1·R1. As a result, the output DO of one NAND gate G1 of the output buffer drops as indicated by a broken line in FIG. 3, and consequently the output potential that must maintain the high level is lowered as shown by a broken line in FIG. 3. Such drop of output potential causes a malfunction.

On the contrary, in the embodiment shown in FIG. 2, since Vcc is supplied to the output transistor circuit 12 and other internal circuit 13 through independent impedances R1 and R3, such a malfunction would not occur. That is, when the bit line precharge pulse $\phi p$ is changed to a high level to place memory all 28 in its precharge state, a large current (I2) flows from Vcc through the impedance R3, and the potential of the Vcc line of the internal circuit 13 drops to Vcc−I2·R3. However, since the Vcc line of the internal circuit 13 and the Vcc line of the output transistor circuit 12 are completely isolated from each other, the potential drop of the Vcc line in the internal circuit 13 does not influence the supply potential of the Vcc line of the output transistor circuit 12 at all. Accordingly, the potential out of the output DO of the output buffer maintains its high level as indicated by the solid line in FIG. 3, and the output potential maintain its high level as shown by the solid line in FIG. 3.

Similarly, when a low level output is delivered from the output terminal out shown in FIG. 2, a malfunction does not occur.

Figure 4:
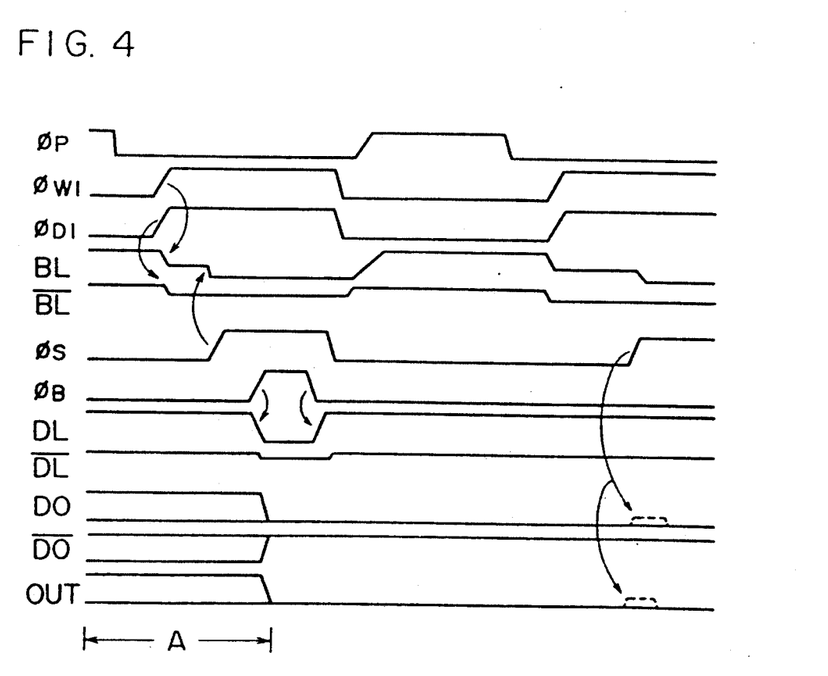

FIG. 4 shows the voltage waveforms of pulses and bit line signals BL and $\overline{BL}$, data line signals DL and $\overline{DL}$, and output buffer output signals DO and $\overline{DO}$ when reading out the L level output to the output terminal 2VT shown in FIG. 2.

In FIG. 4, if, as in the prior art, the Vss line of the internal circuit 13 and output transistor circuit 12 is commonly connected, and the Vss from the external lead for Vss 25 is supplied to the common Vss line through a common impedance (e.g. R2), the following malfunction occurs. That is, when the sense amplifier drive pulse φs is changed to a high level and the sense amplifier 29 is operated, a current (I3) flows in the common impedance R2, and the grounding potential applied to the output buffer is raised to Vss+I3·R2. As a result, as indicated by the broken line in FIG. 4, the output DO of one NAND gate G1 of the output buffer goes up, and consequently the output potential which must maintain the low level is raised as shown by the broken line in FIG. 4. Such a rise of output potential causes a malfunction.

However, in the embodiment shown in FIG. 2, since it is designed to feed Vss to the output transistor circuit 12 and other internal circuit 13 through independent impedances R2 and R4, such a malfunction would not occur. That is, simultaneously with start of operation of the sense amplifier 29, a current (I4) flows into the impedance R4, and if the potential of the Vss line of the internal circuit 13 should rise up to Vss+I4·R4, since the Vss line of the internal circuit 13 and the Vss line of the output transistor line 12 are completely isolated from each other, the potential rise of the Vss line in the internal circuit 13 does not influence the supply potential of the Vss line of the output transistor circuit 12 at all. Hence, the potential of the output DO of the output buffer maintains its low level as indicated by the solid line in FIG. 4, and the output potential out also maintains its low level as indicated by the solid line in FIG. 4.

Incidently, is known from FIG. 2, the output buffer in the output transistor circuit 12 possesses a latch function, and the previous state is held as is. This is because the potentials of the portion of A of DO and $\overline{DO}$ and output are indicated in both high and low levels.

Figure 5:
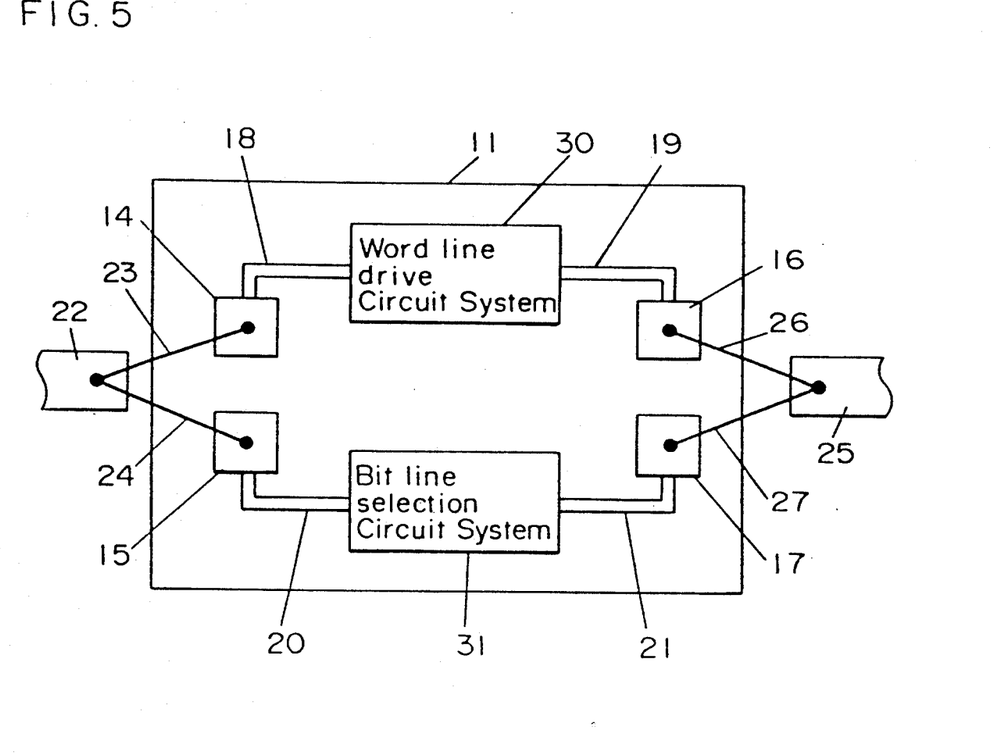
FIG. 5 is a conceptual drawing of a semiconductor device in accordance with a second embodiment of the present invention.

FIG. 5 is a conceptual drawing of a semiconductor device in accordance with a second embodiment of the present invention.

An example of semiconductor memory device is shown in FIG 5, in which the memory circuit composed on the semiconductor substrate 1 is divided into a word line drive circuit system 30 and a bit line selection circuit system 31, and these circuit systems 30 and 31 are independently supplied with Vcc through the same Vcc feed part (22, 23, 14, 18, 24, 15, 20) as in the embodiment in FIG. 2, and with Vss through the same Vss feed part (25, 26, 16, 19, 27, 17, 21) as in the embodiment in FIG. 2.

Figure 6:
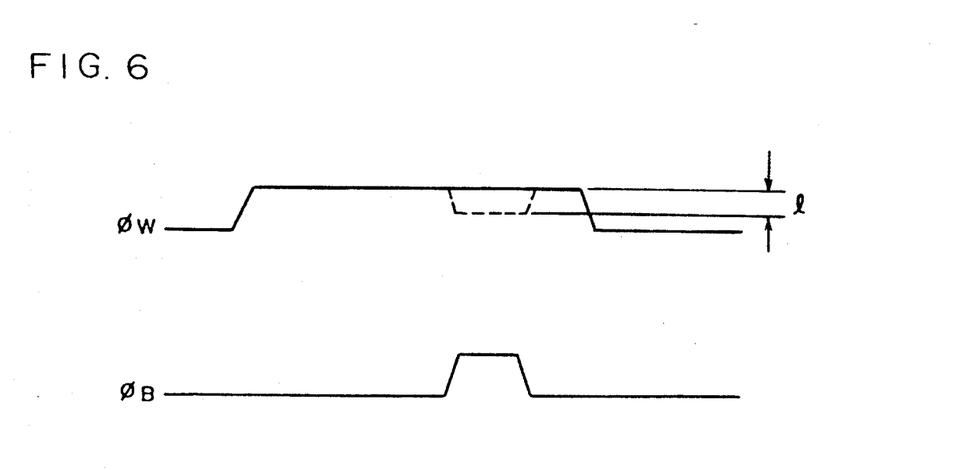
FIG. 6 is a voltage waveform diagram for explaining the operation of FIG. 5.

FIG. 6 is a voltage waveform diagram for explaining the operation of the embodiment shown in FIG. 5.

In the semiconductor memory device, if the word line drive circuit system and bit line selection circuit system are composed in a same circuit block as seen from the aspect of the supply of electrical power, and these circuit systems are provided with Vcc and Vss commonly through common Vcc and Vss feed parts, malfunctions may occur when the bit line selection circuit system operates while the word line is driving. That is, as shown in FIG. 6, if the bit line selection pulse φB is changed to a high level while the word line is being driven as the word line drive pulse φw is changed to a high level, the word line drive pulse φw is fluctuates by a level "1" in this period as indicated by the broken line in FIG. 6. When the potential of the word line drive pulse φw drops, data reading may be impossible or other malfunctions may be caused.

However, when Vcc and Vss are independently supplied to the word line drive circuit system 30 and bit line selection circuit system 31 as in the embodiment shown in FIG. 5, should the bit line selection circuit system 31 operate during word line driving, its action will not influence the action of the word line drive circuit system 30 at all. Accordingly, as indicated by the solid line in FIG. 6, the word line drive pulse φw maintains a high level, and a malfunction of data reading or other malfunctions would not occur.

In the foregoing embodiments, meanwhile, the Vcc and Vss are separately supplied into two circuit blocks, but the same effects will be obtained if only Vcc or Vss is separately supplied into two circuit blocks.

Figure 7:
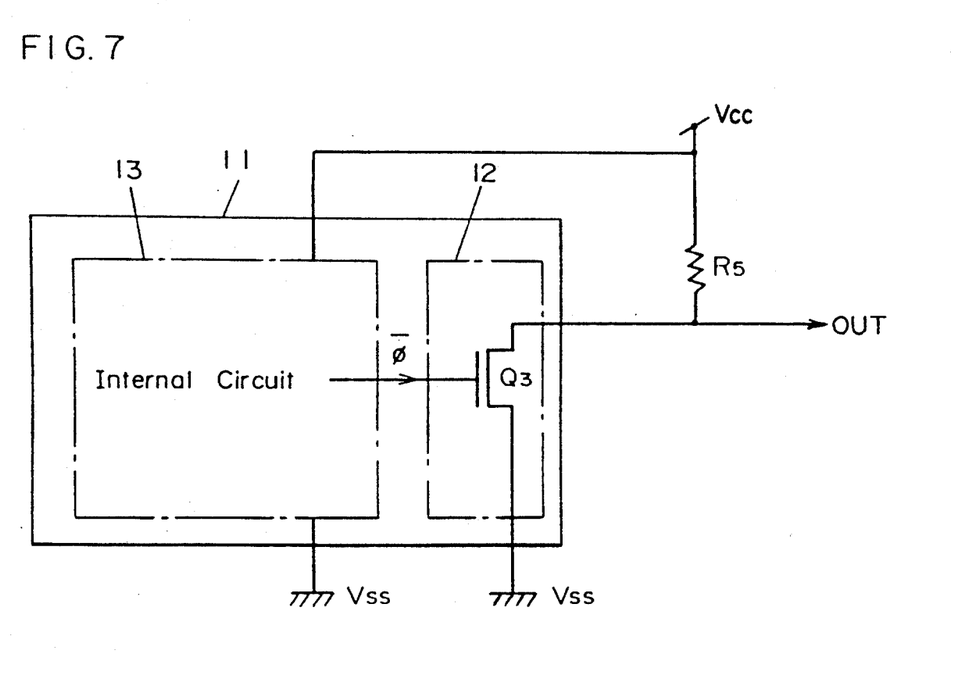
FIG. 7 and FIG. 8 are circuit diagrams showing essential parts of semiconductor devices in accordance with third and fourth embodiments of the present invention.

FIG. 7 shows a third embodiment of the present invention, in which the output transistor circuit 12 of the semiconductor memory device is composed of output transistor Q3, and an output signal is picked up by connecting an external pullup resistor R5 to its drain, said resistor R5 being outside the semiconductor substrate 11. In the semiconductor memory device in such a circuit composition, it is enough to supply only Vss separately into the output transistor circuit 12 and other internal circuit 13.

Figure 8:
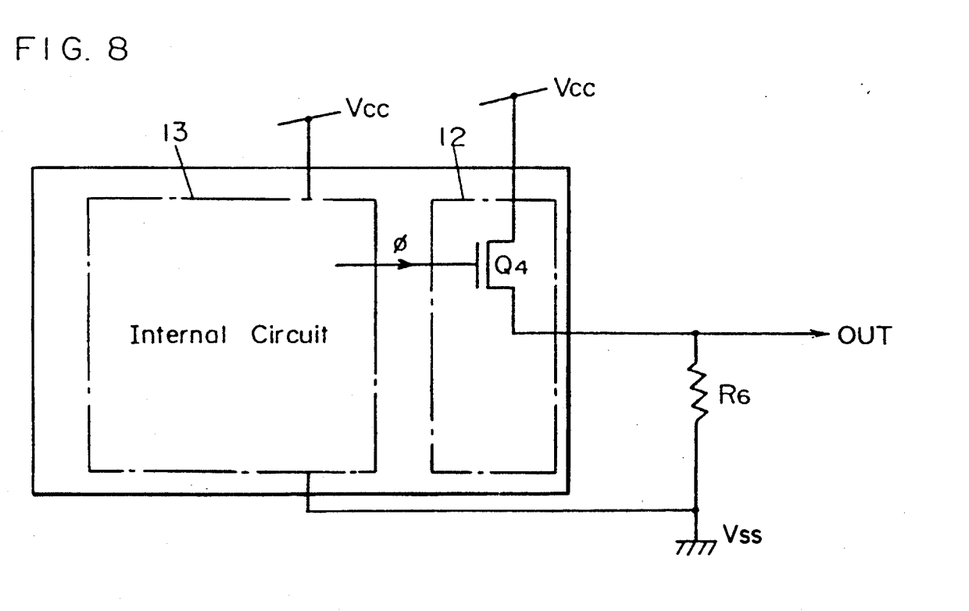

FIG. 8 shows a fourth embodiment of the present invention, in which the output transistor circuit 12 of the semiconductor memory device is composed of output transistor Q4, and an output signal is picked up by connecting an external pulldown resistor R6 to its drain, said resistor R6 being outside the semiconductor substrate 11. In this case, it is enough to supply only Vcc separately into the output transistor circuit 12 and internal circuit 13.

We claim:

1. A semiconductor device comprising:
   a first wiring and a first wire bonding pad for feeding a supply potential to a first circuit block composed on a semiconductor substrate;
   a second wiring and a second wire bonding pad for feeding said supply potential to a second circuit block, excluding said first circuit block composed on said semiconductor substrate;
   a third wiring and a third wire bonding pad for feeding a grounding potential to said first circuit block; and
   a fourth wiring and a fourth wire bonding pad for feeding said grounding potential to said second circuit block, thereby reducing electrical interference between said first and second circuit blocks.

2. A semiconductor memory device comprising:
   a first wiring and a first wire bonding pad for feeding a supply potential to an output transistor circuit composed on a semiconductor substrate;
   a second wiring and a second wire bonding pad for feeding said supply potential to all internal circuits other than said output transistor circuit composed on said semiconductor substrate;
   a third wiring and a third wire bonding pad for feeding a grounding potential to said output transistor circuit; and
   a fourth wiring and a fourth wire bonding pad for feeding said grounding potential to said internal circuits other than said output transistor circuit, thereby reducing electrical interference between said output transistor circuit and siad internal circuits.

3. A semiconductor device according to claim 2, wherein said internal circuits include a memory cell circuit and a sense amplifier circuit for amplifying output data read out from said memory cell circuit, and wherein said grounding potential is fed to said memory cell circuit and said sense amplifier circuit through said fourth wiring and said fourth wire bonding pad.

4. A semiconductor memory device comprising:
   a first wiring and a first wire bonding pad for feeding a supply potential to a word line drive circuit system composed on a semiconductor substrate;
   a second wiring and a second wire bonding pad for feeding said supply potential to a bit line selection circuit system composed on said semiconductor substrate;
   a third wiring and a third wire bonding pad for feeding a grounding potential to said word line drive circuit system; and
   a fourth wiring and a fourth wire bonding pad for feeding said grounding potential to said bit line selection circuit system, thereby reducing electrical interference between said drive circuit system and said selection circuit system.

5. A semiconductor device comprising:
   a first wiring and a first wire bonding pad for feeding a supply potential to a first circuit block composed on a semiconductor substrate; and
   a second wiring and a second wire bonding pad for feeding said supply potential to a second circuit block, excluding said first circuit block composed on said semiconductor substrate, thereby reducing electrical interference between said first and second circuit blocks;
   wherein said first circuit block comprises an output transistor circuit containing an output transistor having a source electrode connected to a ground potential and having a drain electrode connected to an output terminal of said device and also to said supply potential through a pullup resistor.

6. A semiconductor device comprising:
   a first wiring and a first wire bonding pad for feeding a grounding potential to a first circuit block composed on a semiconductor substrate; and
   a second wiring and a second wire bonding pad for feeding said grounding potential to a second circuit block, excluding said first circuit block composed on said semiconductor substrate, thereby reducing electrical interference between said first and second circuit blocks;
   wherein said first circuit block comprises an output transistor circuit containing an output transistor having a source electrode connected to a supply potential and having a drain electrode connected to an output terminal of said device and also to said grounding potential through a pulldown resistor.

* * * * *